United States Patent
Boling, III

Patent Number: 5,793,261
Date of Patent: Aug. 11, 1998

[54] SAW STABILIZED FSK OSCILLATOR CIRCUIT

[75] Inventor: Harry O. Boling, III, Garland, Tex.

[73] Assignee: RF Monolithics, Inc., Dallas, Tex.

[21] Appl. No.: 835,664

[22] Filed: Apr. 10, 1997

[51] Int. Cl.$^6$ ............... H04L 27/12; H03B 5/36
[52] U.S. Cl. ............ 332/102; 331/107 A; 375/272; 375/306
[58] Field of Search .......... 331/107 A; 332/100, 332/102; 375/272, 306

[56] References Cited

U.S. PATENT DOCUMENTS

| | | | |
|---|---|---|---|
| 5,367,537 | 11/1994 | Anderson | 332/102 |
| 5,532,654 | 7/1996 | Ieki et al. | 332/102 |

*Primary Examiner*—Siegfried H. Grimm
*Attorney, Agent, or Firm*—Jones, Day, Reavis & Pogue

[57] ABSTRACT

A digitally-controlled SAW stabilized FSK oscillator circuit having an oscillator and a single-port SAW resonator with a predetermined circuit resonant frequency and being coupled to the oscillator for establishing a first oscillator output frequency, $F_{SAW}$. A bipolar transistor has at least one predetermined shunt capacitance value, C, that is placed in electrical series with the single-port SAW resonator when the transistor is in the OFF state and a closed switch that replaces the capacitance when the transistor is in the ON state to cause the first frequency, $F_{SAW}$, to be generated by the oscillator when the transistor is ON and to cause a second frequency, $F_2$, to be generated by the oscillator when the transistor is in the OFF state.

12 Claims, 3 Drawing Sheets

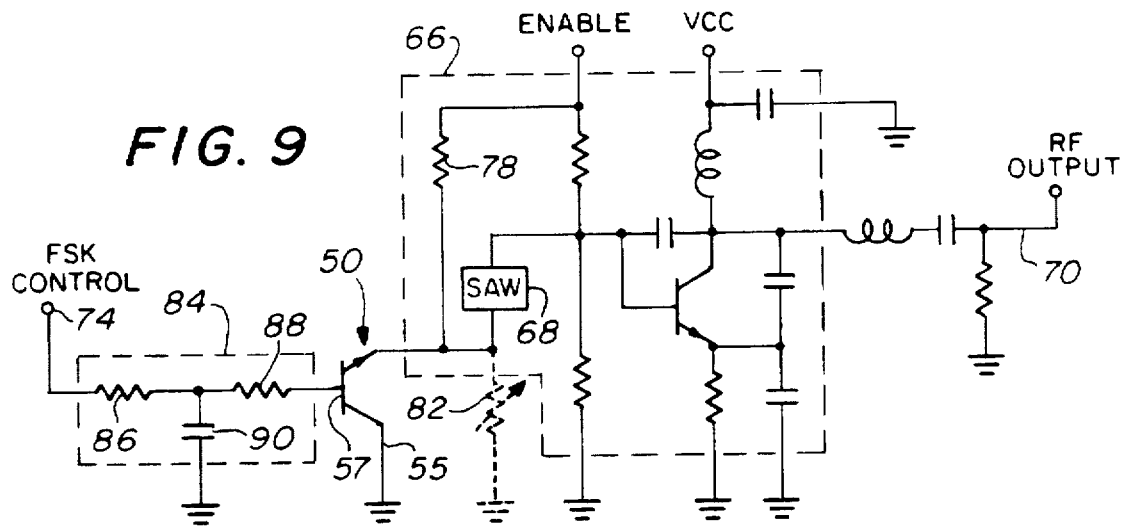
FIG. 9
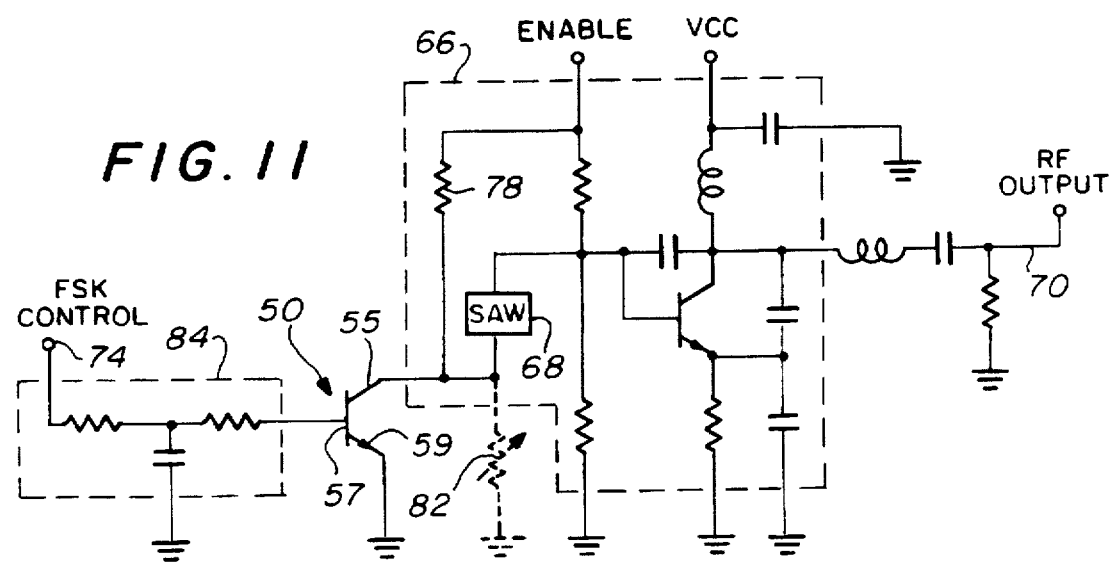
FIG. 10
FIG. 11

SAW STABILIZED FSK OSCILLATOR CIRCUIT

BACKGROUND OF THE INVENTION

1. Field of the Invention

The present invention relates in general to FSK oscillator circuits and in particular to digitally-controlled SAW stabilized FSK oscillator circuits that can be used in FSK transmitters.

2. Description of Related Art Including Information Disclosed Under 37 CFR 1.97 and 1.98

There are many different types of oscillators in the prior art and one such oscillator is known as a frequency shift key (FSK) oscillator. The oscillator in such case generally operates at a first frequency, $F_1$, and when the control input is modulated with a digital-type signal having first and second voltage levels, the frequency shifts between the first frequency, $F_1$, and a second frequency, $F_2$, with a change in the voltage level of the digital control signal. Data transmission systems using such oscillators are desirable because they are considered to be frequency modulated (FM) systems and as such are much less subject to noise and other forms of signal interference than systems using amplitude modulated (AM) signals.

One such FSK oscillator of the prior art utilizes a single-port SAW resonator that controls the basic oscillation frequency of the device. In such an oscillator having a basic Colpitts oscillator circuit arrangement, one of the capacitors in the feedback loop is changed from a first capacitance value to a second capacitance value to cause the oscillator to operate at two separate frequencies, $F_1$, and $F_2$, at least one of which is different from the base frequency of the oscillator caused or set by the SAW resonator. See commonly assigned copending U.S. patent application Ser. No. 08/685, 071 filed Jul. 23, 1996 and now abandoned. Such oscillators are not used to a great extent because of the unreliability of the circuit. For some reason, even though all the circuit elements are maintained substantially identically, subsequent oscillator circuits will have different $F_1$ and/or $F_2$ frequencies with the same control signal applied.

The prior art provides a digitally-controlled SAW stabilized FSK oscillator that enables the oscillator to operate at a first frequency established by the SAW device and a second frequency when a circuit is coupled to the SAW resonator to increase the circuit resonant frequency a predetermined amount. In such case, the oscillator then shifts its output frequency from the first frequency of the SAW device, $F_1$, to a second frequency, $F_2$, caused by the combination of the SAW device and the added circuit means.

The circuit means that is coupled to the single-port SAW resonator for increasing the circuit resonant frequency a predetermined amount includes a capacitor having a predetermined capacitance value, C, in electrical series with a single-port SAW resonator. A switch device is coupled in parallel with the capacitor and has a first position in which the capacitor is by-passed electrically to cause the first frequency, $F_1=F_{SAW}$, to be generated by the oscillator and a second position in which the capacitor is maintained in electrical series with the SAW resonator to cause the second frequency, $F_2$, to be generated by the oscillator.

The switch device may comprise a transistor having a base, an emitter, and a collector. The capacitor, coupled in series with the SAW resonator and ground potential, is also connected between the emitter and the collector of the transistor. When a digital signal source having first and second voltage levels is connected to the transistor base, the transistor is turned ON when the first voltage level is received to establish the oscillator output frequency, $F_{SAW}=F_1$, because the capacitor is short-circuited by the transistor. The transistor is turned OFF when the second voltage level of the digital signal is received to remove the short circuit, leaving the capacitor in electrical series with the SAW resonator to establish the oscillator output frequency, $F_2$.

It will be advantageous to have an FSK oscillator controlled by a single-port SAW resonator that would accurately shift between two different frequencies in a consistent manner without the requirement for a capacitor to be added to the circuit in parallel with a switch. The advantages of such circuit could then be used in a widespread manner.

SUMMARY OF THE INVENTION

The present invention provides an FSK oscillator controlled by a single-port SAW resonator that accurately shifts between two different frequencies without the requirement for a capacitor to be added to the circuit in parallel with a switch.

Thus, the present application uses a bipolar transistor such as the type designated 2N3904 with its emitter and collector connected in series with the surface acoustic wave resonator device. When biased ON, a bipolar transistor can function as a switch serving as a low resistance path between other circuit elements. When reverse-biased, bipolar transistors have inherent inter-electrode capacitances (as well as package capacitance) as shown in FIG. 6A. The capacitance value of these various capacitances is a function of the physical device parameters and the applied reverse bias voltage. When the transistor is turned OFF, the device presents a capacitance to the external circuit which is a resultant of the combination of the individual internal (and package) capacitances. The magnitude of this capacitance is a function of which terminals of the device are involved. For example, if no connection is made to the base lead, the capacitance presented between collector and emitter leads is Cce in parallel with the series combination of Ccb and Cbe or $$Cce(\text{total}) = Cce + \frac{1}{\frac{1}{Ccb} + \frac{1}{Cbe}}$$

If, due to other circuit requirements, the base lead is by-passed to the emitter (or collector) lead with a capacitor of relatively large value, the equivalent capacitance presented to the external circuit becomes Cce in parallel with Ccb (or Cbe), (see FIG. 6B) and Cce(total)=Cce+Ccb. Cbe has no effect.

It is to be understood that no matter which of the transistor terminals are connected in a circuit, there is some internal capacitance which can potentially be exploited by the circuit designer. Thus, any combination of such internal capacitance is denoted herein as at least one internal shunt capacitance.

Because the internal shunt capacitance varies with the bias voltage applied thereto, the amount of effective capacitance can be varied simply by changing the bias voltage applied to the transistor.

Thus, the present invention is a substantial improvement over the prior art since no extra capacitors are required in the circuit to be in parallel with the transistor to be switched in or out of the circuit. Therefore any transistor having sufficient inherent internal shunt capacitance and appropriate switching characteristics can be used according to the present invention to provide an FSK oscillator circuit.

When a digital signal source having first and second voltage level is connected to the transistor base, the transistor is turned ON when the first voltage level is received to establish the oscillator output frequency, $F_{SAW}=F_1$ because no capacitance is in series with the surface acoustic wave resonator device. The transistor is turned OFF when the second voltage level of the digital signal is received. Since the transistor is turned OFF, the internal inherent shunt capacitance now replaces the switch and is in electrical series with the SAW resonator to establish the second oscillator output frequency, $F_2$.

As can be well understood, the digital signal source can be a pulsewidth modulation signal source coupled to the transistor switch. Further, the oscillator itself may be a Colpitts oscillator. An impedance-matching circuit and a coupling capacitor may be connected to the output of the oscillator to couple the modulated FSK signal to the output terminal for further processing.

Thus, the present invention relates to a digitally-controlled SAW stabilized FSK oscillator circuit that has an oscillator, a single-port SAW resonator having a predetermined circuit resonant frequency being coupled to the oscillator for establishing a first oscillator output frequency, $F_{SAW}=F_1$, and a transistor switch having an ON and an OFF state, only the transistor switch being coupled to the single-port SAW resonator for causing the first circuit resonant frequency, $F_{SAW}=F_1$, when the transistor is in the ON state and causing the oscillator to shift its output frequency from the first frequency, $F_{SAW}=F_1$, to a second frequency, $F_2$, when the transistor is in its OFF state.

BRIEF DESCRIPTION OF THE DRAWINGS

These and other features of the present invention will be more fully disclosed when taken in conjunction with the following DETAILED DESCRIPTION OF THE PREFERRED EMBODIMENT(S) in which like numerals represent like elements and in which:

FIG. 9 is a circuit diagram similar to FIG. 8 but in which an RCR filtering network is coupled to the base of the transistor switch;

FIG. 10 is a circuit diagram similar to FIG. 8 except the transistor emitter and collector are reversed in the circuit; and FIG. 11 is a circuit diagram similar to FIG. 9 except the transistor emitter and collector are reversed in the circuit.

DETAILED DESCRIPTION OF THE PREFERRED EMBODIMENT(S)

Figure 1:
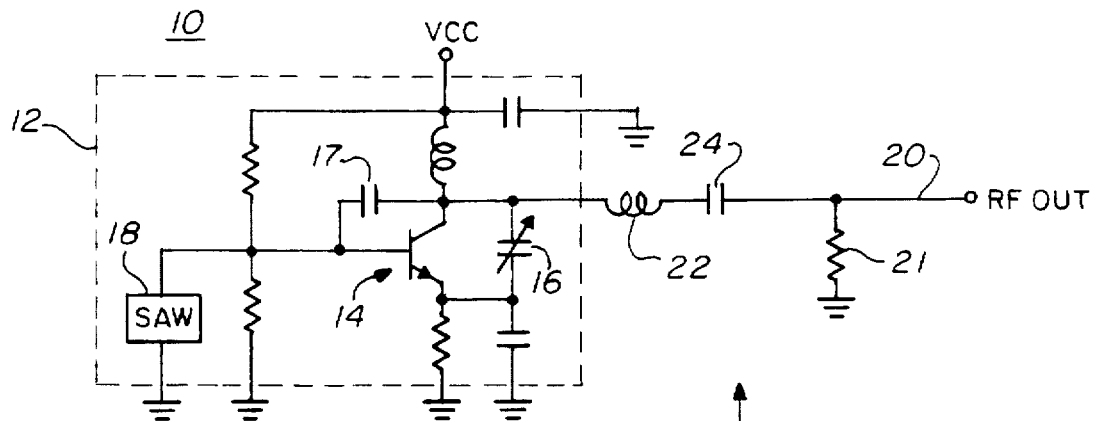
FIG. 1 is a circuit diagram of a prior art FSK oscillator in which the frequency of the oscillator is adjusted by adjusting the value of a capacitor in the feedback circuit.

FIG. 1 is a circuit diagram of a prior art frequency shift key oscillator circuit 10 in which the oscillator 12 has an output frequency, $F_{SAW}$ that is established by a single-port SAW resonator 18 coupled to the base of the transistor 14. The basic oscillator circuit may be a Colpitts oscillator as shown in which a capacitor 16 is coupled between the collector and the emitter of transistor 14 and in which capacitor 17 is coupled in the well-known Miller arrangement between the collector and the base of the transistor 14. Capacitor 16 may be of the electronic type known as VARICAP. Such capacitor is well known in the art and utilizes the depletion region that exists at the p-n junction in a semiconductor diode. This thin sandwich of non-conducting material between the two conducting regions acts as a capacitor. When the diode is reversed biased, the thickness of the depletion region increases thereby decreasing the capacitance. Thus, the junction acts as a voltage-dependent capacitor. This means that the diode can be used as a variable capacitor by applying reverse bias, the capacity depending on the applied DC voltage. A reverse-biased diode can be used as a tuning element in a radio-frequency circuit. Diodes specially manufactured for this purpose are known as varactors or VARICAPS and typically have a variation of capacity from 5 to 100 pF.

Figure 2:
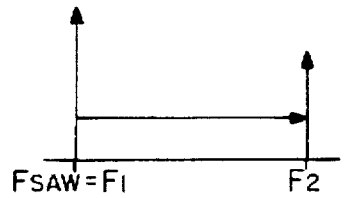
FIG. 2 is an illustration of the frequency shift that is developed by the oscillator of FIG. 1.

Thus, by changing a voltage applied to the VARICAP represented by capacitor 16, the frequency of the oscillator 12 output on line 20 will change as indicated in FIG. 2. The frequency, $F_{SAW}$, represents the output frequency, $F_1$, of the oscillator caused by the SAW device 18. When voltage applied to the VARICAP causes a second capacitance value, the frequency shifts to $F_2$ as shown in FIG. 2. The problem with the oscillator occurs when the circuit is manufactured. Although the circuit element values can be meticulously repeated in the manufacture of subsequent oscillators, when the same voltage is applied to the varicap to change the circuit output frequency to $F_2$, the frequencies of the subsequent oscillators may be entirely different from each other. There are no reliably consistent output frequencies between the different oscillators that are manufactured. These performance inconsistencies are frequently compensated for by use of adjustable circuit elements (i.e. trimmer capacitors) which limit manufacturability of the circuit.

It is well known that the frequency of an oscillator that is SAW stabilized by a single-port SAW resonator is dependent on the resonant frequency of the SAW device. Thus, for a particular output frequency, a SAW resonator is designed with a particular resonant frequency to cause the oscillator to generate a particular output frequency.

Figure 3:
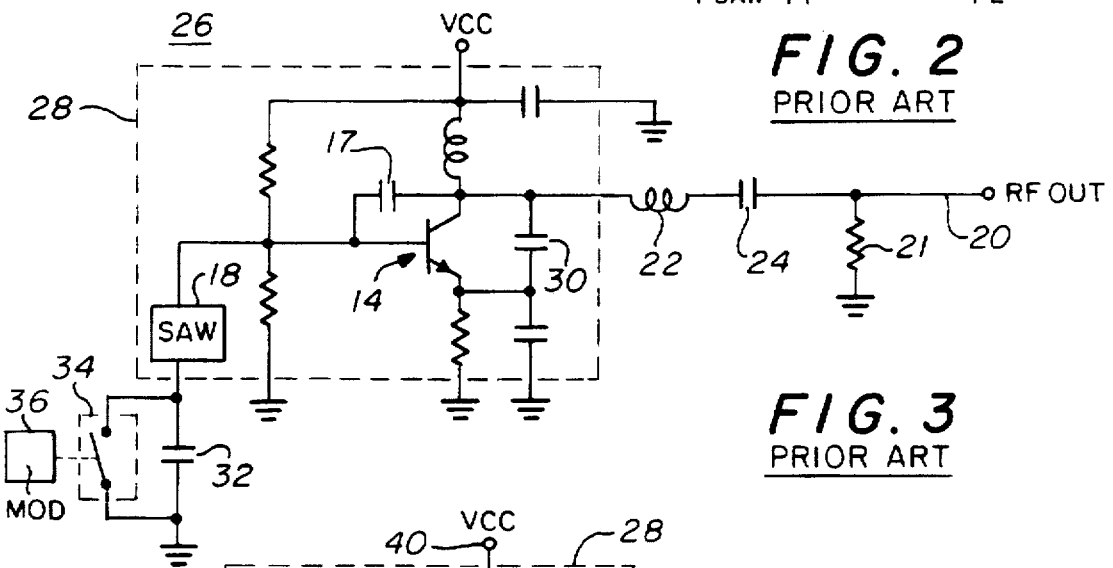
FIG. 3 is a circuit diagram of another embodiment of a prior art FSK oscillator.

A particular prior art embodiment utilizes that principle to modify existing SAW oscillator circuits. Thus, as can be seen in FIG. 3, a capacitor 32 is added in series with the single-port SAW resonator 18 to increase the resonant frequency a predetermined amount to cause the oscillator to shift its output frequency from the first frequency, $F_{SAW}=F_1$, to a second frequency, $F_2$. By placing an electronic switch 34 in parallel with capacitor 32, the capacitor can either be removed from the circuit by being shorted out by switch 34 or added in series with the single-port SAW resonator 18 if the switch 34 is open. When the capacitor 32 is coupled in series with SAW resonator 18, the output frequency of the oscillator 28 shifts from $F_1$ to $F_2$. Again, as shown in FIG. 2 where the frequency $F_{SAW}$ equals a first frequency, $F_1$, when the capacitor 32 is added in series with the SAW device 18 by opening switch 34, the oscillator output shifts to the second frequency, $F_2$. However, with the circuit of FIG. 3, it has been found that this shift is consistent and reliable from oscillator-to-oscillator. A digital source 36 provides digital signals having first and second voltage levels. The digital signal source 36 is connected to switch 34 to control it such that it is opened or closed thus either removing or adding capacitor 32 in the series circuit with the single-port SAW resonator 18.

Figure 4:
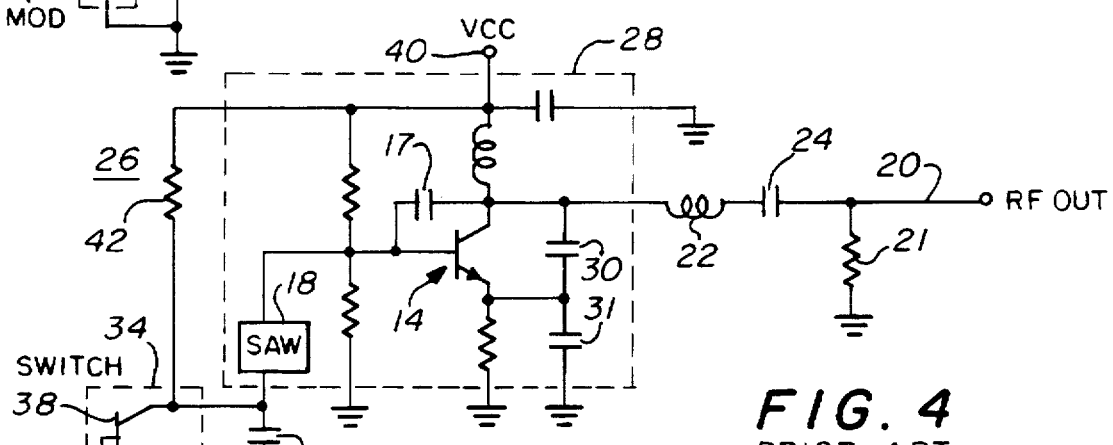
FIG. 4 is a circuit diagram corresponding to FIG. 3 and illustrating the details of the electronic switch that controls the shift in the output frequency of the novel FSK oscillator.

FIG. 4 illustrates the details of switch 34 and the digital signal source 36. Switch 34 may include a transistor 38 whose emitter and collector are connected across capacitor 32. Voltage source 40 is coupled through resistor 42 to the collector of transistor 38. The digital signal source 36 includes an input terminal 44 for receiving digital pulses such as pulsewidth modulation signals that are coupled through a low-pass filter formed of resistor 46 and capacitor 48. Capacitor 48, in relation to capacitor 32, has no noticeable effect on the operation of the oscillator. The digital signals are coupled to the base of transistor 38. As can be shown in FIG. 5, when the pulses have a first voltage level $V_1$, transistor 38 is turned ON and provides a substantial short across capacitor 32 thus effectively removing it from the circuit. The oscillator circuit 28 then generates an output signal, $F_{SAW}=F_1$, on line 20 across load resistor 21 through the impedance-matching circuit 22 and the DC blocking capacitor 24.

Figure 5:
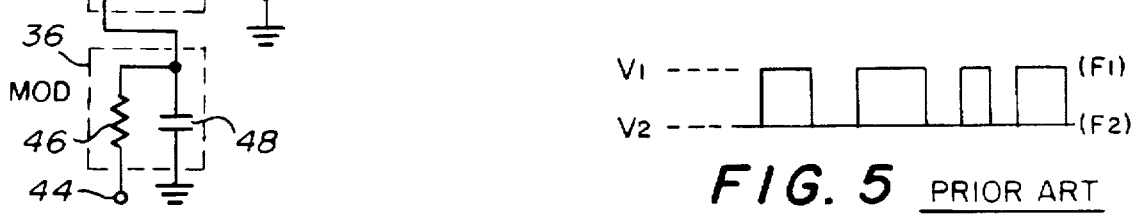
FIG. 5 is an illustration of the pulsewidth modulation signals that are applied to the switch as the digital signal source for controlling the frequency shift of the prior art FSK oscillator of the present invention.

When the pulses shown in FIG. 5 have a second voltage level designated $V_2$, the transistor 38 is turned OFF and the capacitor 32 is inserted in series with the single-port SAW resonator 18 thus increasing the resonant frequency of the series circuit and causing the oscillator to shift its output frequency to $F_2$ on line 20. In such case, it has been found that the oscillator circuit 28 provides stable, reliable, and predictable outputs of $F_{SAW}$ and $F_2$ depending upon whether capacitor 32 is shunted out of this circuit or if it is present in the series circuit with the SAW device 18.

Thus the oscillator circuit 28 as shown is a typical Colpitts SAW oscillator circuit using capacitors 30 and 31 to provide the basic Colpitts circuit and utilizing a Miller feedback capacitor 17 for circuit stability. Coil 22 is an impedance-matching coil and capacitor 24 is a DC blocking capacitor.

Figure 6A:
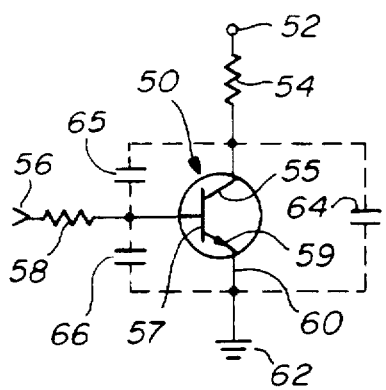
FIGS. 6A and 6B are circuit diagrams of a prior art bipolar transistor illustrating connections of the inherent internal shunt capacitances of the transistor in its OFF state.
Figure 6B:
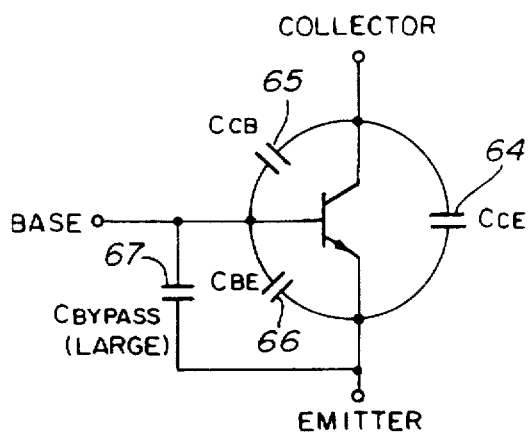
Figure 7:
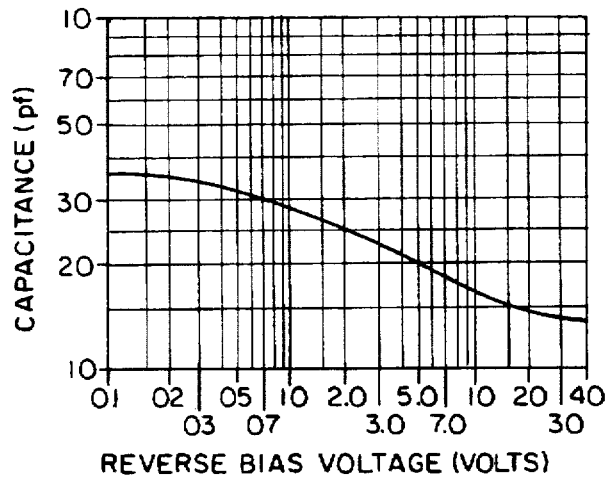
FIG. 7 is a graph of the performance of the transistor shown in FIG. 6A and illustrating how one of the inherent internal shunt capacitances of the transistor varies with a variation in bias voltage applied thereto.

FIG. 6A is a circuit diagram of a prior art transistor 50 coupled in a reverse biased configuration. The power supply 52 is coupled through a load resistor 54 to the transistor collector 55. A signal source 56 is coupled to the base 57 through a resistor 58. The emitter 59 is coupled on line 60 to a ground 62. It will be noted that shunt capacitances 64, 65, and 66, illustrated in phantom lines, are inherent in transistor 50. This means that when the transistor 50 is non-conducting, the shunt capacitances 64, 65, and 66 replace the transistor switch and couple the emitter 59 to the collector 55. Interestingly enough, if the bias voltage on the collector is varied, the value of the shunt capacitances 64, 65, and 66 also varies. FIG. 6B illustrates the transistor of FIG. 6A with a large value RF by-pass capacitor 67 on the input to the base. Note in FIG. 7 the graph of only one of the internal capacitances versus the reverse bias voltage applied to the transistor 50. It will be noted that at essentially zero bias, the shunt capacitance $C_8$ is approximately 3½ pF. Note, also, that when the bias voltage has increased to 20 volts, the shunt capacitance $C_8$ is reduced to approximately 1.5 pF.

Using this principle, Applicant has devised a novel digitally controlled SAW stabilized FSK oscillator circuit that does not require a separate capacitor as in the prior art that couples the emitter and the collector and that is shorted out by the transistor when it conducts.

Figure 8:
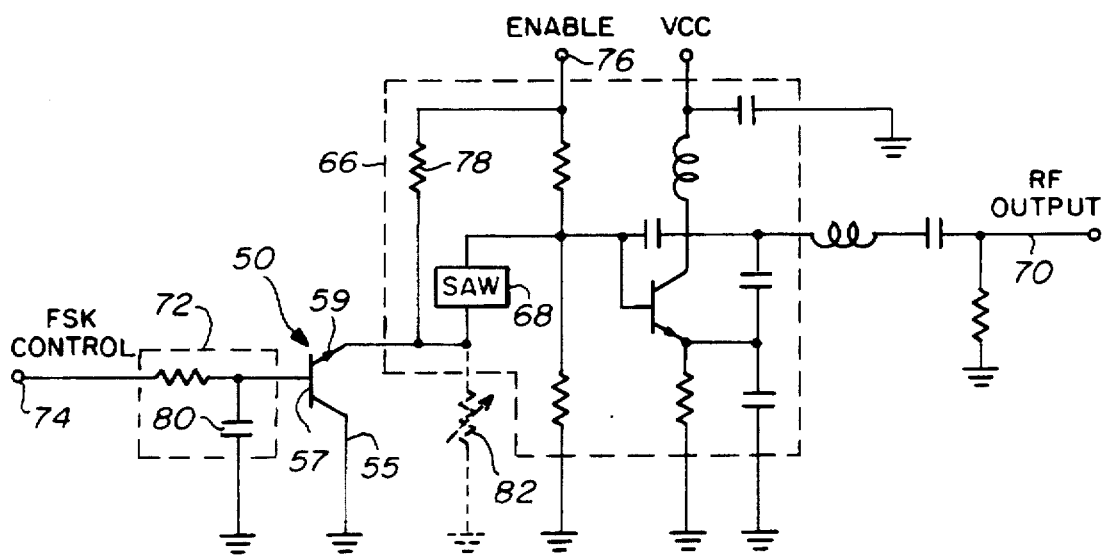
FIG. 8 is a circuit diagram of one embodiment of the novel invention of the present disclosure illustrating an RC filtering network on the base of the transistor switch for receiving the FSK control signal.

FIG. 8 discloses the preferred embodiment of the novel invention. In FIG. 8, the emitter/collector connections are reversed with respect to that shown in FIG. 6A or 6B. In FIG. 8, the transistor 50 has its emitter 59 connected to the SAW device 68 in oscillator circuit 66. The collector 55 is connected to ground and the base 57 receives the FSK control signal from terminal 74 through RF filter circuit 72. The transistor is a well-known 2N3904. When a control signal having a particular polarity appears at terminal 74 and is coupled to the base 57, transistor 50 is turned ON and becomes a closed switch between the collector and the emitter coupling the SAW device 68 to ground through the emitter/collector connection of transistor 50. In that case, the output of the oscillator 66 on line 70 is $F_{SAW}=F_1$. When a signal of the opposite polarity appears on control terminal 74 and is coupled to base 57 of transistor 50, the transistor ceases conduction and at least one internal transistor shunt capacitance designated by the numeral 64 in FIG. 6A replaces the closed switch and is coupled in series with the SAW device 68 thus causing the frequency of the oscillator to shift from $F_1$ to $F_2$.

Capacitor 80 in filter 72 is a size such that it has no impact on the frequency of oscillation of oscillator circuit 66. However, it does affect the rate of frequency shift of the output waveform from the oscillator. The results of testing the circuit shown in FIG. 8 utilizing different values of RF filter capacitor 80 are shown in Table I.

TABLE I

| | Mod Input Vdc = 3 V | | | Mod Input Vdc = 0 V | | | Deltas | | Cont. Sig./Freq. Shift Delay (50% Point) | |
|---|---|---|---|---|---|---|---|---|---|---|
| C6 | Cur(saw) | Freq(saw) | FO(saw) | Cur(diff) | Freq(diff) | FO(diff) | Freq Delta | FO Delta | FLO to FHI | FHI to FLO |
| pF | mAmp | MHz | dBm | mAmp | MHz | dBm | MHz | dBm | u Sec | u Sec |
| 0 | 9.18 | 433.865 | −0.26 | 8.77 | 433.935 | −2.80 | 0.070 | 2.54 | 0.23 | 0.33 |
| 10 | 9.16 | 433.865 | −0.24 | 8.81 | 433.923 | −2.01 | 0.058 | 1.77 | 0.22 | 0.32 |
| 22 | 9.15 | 433.865 | −0.21 | 8.81 | 433.918 | −1.82 | 0.053 | 1.81 | 0.24 | 0.30 |
| 47 | 9.18 | 433.863 | −0.26 | 8.82 | 433.915 | −1.98 | 0.052 | 1.72 | 0.25 | 0.28 |
| 100 | 9.16 | 433.863 | −0.28 | 8.81 | 433.913 | −1.91 | 0.050 | 1.63 | 0.28 | 0.32 |
| 220 | 9.10 | 433.860 | −0.33 | 8.78 | 433.913 | −1.87 | 0.053 | 1.54 | 0.38 | 0.30 |
| 470 | 9.16 | 433.865 | −0.28 | 8.81 | 433.913 | −1.98 | 0.048 | 1.70 | 0.52 | 0.35 |
| 1000 | 9.16 | 433.865 | −0.16 | 8.81 | 433.913 | −1.91 | 0.048 | 1.75 | 0.75 | 0.42 |

As can be seen in Table I, the first column shows the value of the capacitor 80 (C6) in pF from 0–1000. With a modulation input DC voltage of three volts (columns 2, 3, and 4), it can be seen that the current through the oscillator circuit remains substantially constant over the entire range and that the frequency of the surface acoustic wave varies very little. Also, the output power, $F_O$, of the fundamental frequency of the SAW device is essentially constant.

FIG. 9 is an electrical circuit diagram of the FSK oscillator 66 that is identical to that illustrated in FIG. 8. Again, transistor 50 has its emitter coupled to one side of the SAW device 68. However, the filter circuit 84 includes series resistors 86 and 88 having the junction thereof coupled to ground by capacitor 90. Again, capacitor 90 couples the RF signals to ground. The results of testing the device using this filter circuit 84 are shown in TABLE II.

TABLE II

| | Mod Input Vdc = 3 V | | | Mod Input Vdc = 0 V | | | Deltas | | Cont. Sig./Freq. Shift Delay (50% Point) | |
|---|---|---|---|---|---|---|---|---|---|---|
| C6 | Cur(saw) | Freq(saw) | FO(saw) | Cur(diff) | Freq(diff) | FO(diff) | Freq Delta | FO Delta | FLO to FHI | FHI to FLO |
| pF | mAmp | MHz | dBm | mAmp | MHz | dBm | MHz | dBm | u Sec | u Sec |
| 0 | 9.20 | 433.860 | −0.24 | 8.77 | 433.935 | −2.89 | 0.075 | 2.65 | 0.19 | 0.50 |
| 10 | 9.18 | 433.863 | −0.19 | 8.75 | 433.935 | −2.94 | 0.072 | 2.75 | 0.20 | 0.56 |
| 22 | 9.20 | 433.860 | −0.26 | 8.76 | 433.935 | −2.99 | 0.075 | 2.73 | 0.21 | 0.55 |
| 47 | 9.18 | 433.863 | −0.21 | 8.75 | 433.935 | −2.96 | 0.072 | 2.75 | 0.22 | 0.58 |
| 100 | 9.20 | 433.863 | −0.28 | 8.74 | 433.935 | −2.87 | 0.072 | 2.59 | 0.26 | 0.62 |
| 220 | 9.18 | 433.863 | −0.19 | 8.75 | 433.935 | −2.94 | 0.072 | 2.75 | 0.32 | 0.72 |
| 470 | 9.19 | 433.863 | −0.21 | 8.76 | 433.935 | −2.96 | 0.072 | 2.75 | 0.46 | 0.92 |
| 1000 | 9.18 | 433.863 | −0.07 | 8.75 | 433.935 | −2.89 | 0.072 | 2.82 | 0.66 | 1.35 |

When the modulation input DC voltage is reduced to zero volts (columns 5–7) and the transistor ceases conduction, the oscillator changes frequency as can be seen under the delta column with the frequency delta in megahertz illustrating the shift. Further, in the $F_O$ delta column, the difference in signal power (in dBm) can be seen between the $F_1$ signal versus the $F_2$ signal. Finally, in the last two columns of Table I, the signal frequency shift delay going from low to high and from high to low can be seen. It is noted that after C6 reaches a value of 100 pF, the delays in the signals from low to high and high to low begin to increase significantly. While in some instances, a circuit having a 1000 pF capacitor could be used; in the preferred embodiment here, it was decided to use C6 as 100 pF maximum to give the minimum loss in signal power and the minimum frequency shift delays.

Here it can be seen in the seventh column from the left headed "OF (diff)" that the output signal is significantly reduced at the shifted frequency. Again, the frequency shift delay from $F_{lo}$ to $F_{hi}$ becomes excessive after C6 is 100 pF, but the frequency shift delay from $F_{hi}$ to $F_{lo}$ is excessive in all ranges. There may be circumstances under which such frequency shift delay could be used, but for purposes of the FSK oscillator, the shift delay is too great to be desirable.

FIG. 10 is a circuit diagram of an FSK oscillator circuit that is identical to that shown in FIG. 8 except that transistor 50 has the emitter/collector connections reversed. Thus, in this case, collector 55 is coupled to one end of the SAW device 68 while the emitter 59 is connected to ground. The filter circuit 72 comprises a resistor coupled to the base 57 of the transistor 50 and a capacitor, C6, coupled between the base 57 and ground. The test results of this circuit are illustrated in Table III.

TABLE III

| | Mod Input Vdc = 3 V | | | Mod Input Vdc = 0 V | | | Deltas | | Cont. Sig./Freq. Shift Delay (50% Point) | |
|---|---|---|---|---|---|---|---|---|---|---|
| C6 | Cur(saw) | Freq(saw) | FO(saw) | Cur(diff) | Freq(diff) | FO(diff) | Freq Delta | FO Delta | FLO to FHI | FHI to FLO |
| pF | mAmp | MHz | dBm | mAmp | MHz | dBm | MHz | dBm | u Sec | u Sec |
| 0 | 9.34 | 433.855 | −0.16 | 8.73 | 433.943 | −3.03 | 0.088 | 2.87 | 0.18 | 0.64 |
| 10 | 9.28 | 433.855 | −0.28 | 8.77 | 433.938 | −2.71 | 0.083 | 2.43 | 0.18 | 0.58 |
| 22 | 9.28 | 433.860 | −0.03 | 8.76 | 433.938 | −2.54 | 0.078 | 2.51 | 0.20 | 0.56 |
| 47 | 9.34 | 433.855 | 0.42 | 8.76 | 433.935 | −2.57 | 0.080 | 2.99 | 0.22 | 0.60 |
| 100 | 9.36 | 433.855 | 0.42 | 8.77 | 433.938 | −2.54 | 0.083 | 2.96 | 0.16 | 0.64 |
| 220 | 9.32 | 433.853 | 0.30 | 8.76 | 433.935 | −2.54 | 0.082 | 2.84 | 0.20 | 0.68 |
| 470 | 9.35 | 433.855 | 0.32 | 8.77 | 433.935 | −2.59 | 0.080 | 2.91 | 0.34 | 0.76 |
| 1000 | 9.37 | 433.853 | 0.30 | 8.79 | 433.935 | −2.61 | 0.082 | 2.91 | 0.58 | 0.96 |

Note, also, in FIG. 8 the resistor 82 in phantom lines that is coupled to the emitter 59 of transistor 50. By varying the size of resistor 82 with respect to resistor 78, a voltage divider network is created which can be used to select the desired reverse bias voltage on transistor 50. This enables the inherent shunt capacitance of the transistor 50 to be varied according to the graph shown in FIG. 7. By representing resistor 82 as being a variable resistor, it is meant that a resistor of any desired size could be used to cause the desired reverse bias voltage applied to transistor 50.

It will be noted that the $F_O$ (diff), the shifted output signal, is significantly lower in power level than the reference $F_O$ (SAW) signal. In like manner, the frequency shift delays from $F_{hi}$ to $F_{lo}$ are all greatly increased over those shown for the circuit in FIG. 8.

FIG. 11 is a circuit diagram of an oscillator that is identical to FIG. 9 except, again, the emitter/collector of transmitter 50 are reversed in FIG. 11. Thus, the collector 55 is connected to the SAW device 68 and the emitter 59 is coupled to ground. The test results of this circuit are illustrated in Table IV.

TABLE IV

| C6 pF | Mod Input Vdc = 3 V | | | Mod Input Vdc = 0 V | | | Deltas | | Cont. Sig./Freq. Shift Delay (50% Point) | |
|---|---|---|---|---|---|---|---|---|---|---|
| | Cur(saw) mAmp | Freq(saw) MHz | FO(saw) dBm | Cur(diff) mAmp | Freq(diff) MHz | FO(diff) dBm | Freq Delta MHz | FO Delta dBm | FLO to FHI u Sec | FHI to FLO u Sec |
| 0 | 9.36 | 433.853 | −0.10 | 8.75 | 433.943 | −3.10 | 0.090 | 3.00 | 0.18 | 0.66 |
| 10 | 9.33 | 433.855 | 0.00 | 8.72 | 433.943 | −3.06 | 0.088 | 3.06 | 0.22 | 0.66 |
| 22 | 9.33 | 433.855 | 0.00 | 8.73 | 433.943 | −3.03 | 0.088 | 3.03 | 0.22 | 0.66 |
| 47 | 9.33 | 433.853 | −0.17 | 8.73 | 433.940 | −3.15 | 0.087 | 2.98 | 0.22 | 0.68 |
| 100 | 9.34 | 433.855 | −0.07 | 8.73 | 433.943 | −3.08 | 0.088 | 3.01 | 0.24 | 0.76 |
| 220 | 9.33 | 433.853 | −0.19 | 8.73 | 433.940 | −3.06 | 0.087 | 2.87 | 0.28 | 0.86 |
| 470 | 9.34 | 433.855 | −0.16 | 8.73 | 433.940 | −3.15 | 0.085 | 2.99 | 0.34 | 1.16 |
| 1000 | 9.30 | 433.850 | −0.35 | 8.71 | 433.940 | −3.10 | 0.090 | 2.75 | 0.50 | 1.78 |

Again it will be seen that the output signal $F_O$ is significantly reduced in amplitude and that the frequency shift from $F_{hi}$ to $F_{lo}$ is excessive.

Again, any one of these circuits may be used as an oscillator circuit for some purposes. However, the preferred embodiment is that shown in FIG. 8 with the capacitor C6 or capacitor 80 in FIG. 8 having a value in the range of from about 0 pF to about 100 pF. Thus, it will be noted in each of these embodiments that the capacitor C6 (80 in FIG. 8 and 90 in FIG. 9) has no effect upon the oscillation frequency of the FSK oscillator. Thus capacitor C6 (80 in FIG. 8, 90 in FIG. 9) is simply a filter capacitor as it was originally intended and is not being switched in or out of a circuit to change the frequency of oscillation of the oscillator circuit.

Thus there has been disclosed a novel digitally-controlled SAW stabilized FSK oscillator circuit that improves over prior art circuits by allowing the FSK oscillator to operate at two stable frequencies that are predictable and reliable from oscillator-to-oscillator without the use of a capacitor switched into or out of series with the SAW device. The circuit is digitally controlled through the use of pulses such as pulsewidth modulation-type digital pulses. The impedance-matching circuit and blocking capacitor provide an FSK output to be transmitted at RF frequencies. The FSK signal can, of course, be demodulated as is well known in the art and the modulation signal recovered.

The corresponding structures, materials, acts, and equivalents of all means or step plus function elements in the claims below are intended to include any structure, material, or act for performing the function in combination with other claimed elements as specifically claimed.

What is claimed is:

1. A digitally-controlled SAW stabilized FSK oscillator circuit comprising:

an oscillator;

a single-port SAW resonator having a predetermined circuit resonant frequency and being coupled to the oscillator for establishing a first oscillator output frequency, $F_{SAW}$; and a transistor having an ON and an OFF state, only said transistor being coupled in series with the single-port SAW resonator for establishing the first frequency, $F_{SAW}$, when the transistor is in the ON state and causing said oscillator to shift its output frequency from the first frequency, $F_{SAW}$, to a second frequency, $F_2$, when said transistor is in its OFF state.

2. A SAW stabilized FSK oscillator circuit as in claim 1 wherein said transistor comprises:

a bipolar transistor having at least one inherent internal capacitance value, C; and said bipolar transistor having an ON state in which it is a switch to couple the SAW resonator to ground to cause said first frequency, $F_{SAW}$, to be generated by said oscillator and a second OFF position in which said at least one internal capacitance replaces said switch in electrical series with said SAW resonator to cause said second frequency, $F_2$, to be generated by said oscillator.

3. A SAW stabilized FSK oscillator circuit as in claim 2 wherein said bipolar transistor comprises:

a transistor having a base, an emitter, and a collector;

an internal switch being formed that connects said emitter and said collector when said transistor is in the ON state;

said at least one internal capacitance being a shunt capacitance replacing said switch between said emitter and said collector when said transistor is in the OFF state; and a digital signal source for providing digital signals having first and second voltage levels, said digital signal source being connected to said transistor base for turning said transistor ON when said first voltage level is received to establish the oscillator output frequency, $F_{SAW}$, and for turning said transistor OFF when said second voltage level is received to replace said switch with said internal capacitance in electrical series with said SAW resonator to establish the oscillator output frequency, $F_2$.

4. A SAW stabilized FSK oscillator circuit as in claim 3 further comprising a pulsewidth modulation signal source being used as said digital signal source.

5. A digitally-controlled SAW stabilized FSK oscillator circuit as in claim 1 wherein said oscillator is a Colpitts oscillator.

6. A digitally-controlled SAW stabilized FSK oscillator circuit as in claim 4 wherein said oscillator is a Colpitts oscillator.

7. A digitally-controlled SAW stabilized FSK oscillator circuit as in claim 3 further comprising:

a power source;

a first resistor coupling said power source to the series connection between said transistor and said SAW resonator; and a second resistor coupled to said first resistor to form a voltage divider that causes a predetermined voltage to be applied to said transistor/SAW resonator series connection thereby determining at least one internal capacitance value of said transistor.

8. A digitally-controlled SAW stabilized FSK oscillator circuit as in claim 3 further including:

an RF ground potential by-pass capacitor coupled between the base of said transistor and said ground potential for preventing RF oscillator signals from reaching said digital signal source; and said RF by-pass capacitor being of a size to have no effect on the oscillator frequency.

9. A digitally-controlled SAW stabilized FSK oscillator circuit as in claim 3 further comprising:

a ground potential;

an RF by-pass filter circuit coupled to the base of said transistor, said by-pass filter including first and second series connected resistors and a capacitor coupling the junction of said series coupled resistor to ground potential; and said capacitor having no effect on the oscillator frequency.

10. A SAW stabilized FSK oscillator for use in an FSK transmitter comprising:

an oscillator;

a single-port SAW resonator having a predetermined circuit resonant frequency and being coupled to the oscillator for establishing a first oscillator output frequency, $F_{SAW}$;

a bipolar transistor in electrical series with said single-port SAW resonator, said bipolar transistor having at least one inherent internal shunt capacitance value, C;

said transistor having a first conducting state forming a closed switch to cause said first frequency, $F_{SAW}$, to be generated by said oscillator and a second non-conducting state in which said at least one inherent internal shunt capacitance replaces said closed switch and is coupled in electrical series with said SAW resonator to cause said second frequency, $F_2$, to be generated by said oscillator;

a digital data source being coupled to said bipolar transistor for causing said bipolar transistor to change between said first and second states; and an impedance-matching circuit coupled to said oscillator output for providing an FSK output to be transmitted at RF frequencies.

11. A SAW stabilized FSK oscillator circuit as in claim 10 further comprising a pulsewidth modulation signal source being used as said digital data source.

12. A digitally-controlled SAW stabilized FSK oscillator circuit as in claim 10 further comprising:

a power source;

a first resistor coupling said power source to the series connection between said transistor and said SAW resonator; and a second resistor coupled to said first resistor to form a voltage divider that causes a predetermined voltage to be applied to said transistor/SAW resonator series connection thereby determining the at least one internal shunt capacitance value of said transistor.

\* \* \* \* \*